United States Patent
Yamamoto et al.

(10) Patent No.: US 8,319,229 B2
(45) Date of Patent: Nov. 27, 2012

(54) OPTICAL SEMICONDUCTOR DEVICE AND METHOD FOR MANUFACTURING THE SAME

(75) Inventors: Tsuyoshi Yamamoto, Kawasaki (JP); Manabu Matsuda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/880,364

(22) Filed: Sep. 13, 2010

(65) Prior Publication Data
US 2010/0327257 A1 Dec. 30, 2010

Related U.S. Application Data

(63) Continuation of application No. PCT/JP2008/055002, filed on Mar. 18, 2008.

(51) Int. Cl.
*H01L 27/15* (2006.01)
*H01L 21/00* (2006.01)

(52) U.S. Cl. .......... 257/80; 257/184; 257/E33.005; 257/E31.002; 257/E31.032; 257/E31.127; 438/24; 438/31; 438/32; 438/72

(58) Field of Classification Search .......... 257/80, 257/81, 98, 184, 432, E33.005, E33.006, 257/E31.002, E31.032, E31.127; 438/24, 438/29, 31, 32, 72; 313/504, 506; 428/690, 428/917

See application file for complete search history.

(56) References Cited

U.S. PATENT DOCUMENTS

| 7,949,020 B2 * | 5/2011 | Kato ............................... 372/20 |
| 2006/0291516 A1 | 12/2006 | Aoki |
| 2007/0041415 A1 | 2/2007 | Fujiwara |
| 2010/0265980 A1 * | 10/2010 | Matsuda .................... 372/46.01 |

FOREIGN PATENT DOCUMENTS

| JP | 63-228795 | 9/1988 |
| JP | 2-66984 | 3/1990 |
| JP | 8-255954 | 10/1996 |
| JP | 2002-353559 A1 | 12/2002 |
| JP | 2007-5594 A1 | 1/2007 |
| WO | WO 2005/091452 A1 | 9/2005 |

OTHER PUBLICATIONS

K. Nakahara, et al.; "High Extinction Ratio Operation at 40-Gb/s Direct Modulation in 1.3μm InGaAlAs-MQW RWG DFB Lasers;" Technical Digest of OFC 2006; OWC5; 3 Sheets.
International Search Report for International Application No. PCT/JP2008/055002 dated Apr. 2, 2008.

* cited by examiner

*Primary Examiner* — Hsien Ming Lee
(74) *Attorney, Agent, or Firm* — Kratz, Quintos & Hanson, LLP

(57) ABSTRACT

An optical semiconductor device is disclosed including an active region including an active layer and a diffraction grating having a λ/4 phase shift; passive waveguide regions each including a passive waveguide and a diffraction grating, disposed on the side of an emission facet and on the side of a rear facet sandwiching the active region between the passive waveguide regions, respectively; and an anti-reflection coating applied on the emission facet, wherein the passive waveguide region on the side of the emission facet has a length shorter than a length of the passive waveguide region on the side of the rear facet side.

20 Claims, 10 Drawing Sheets

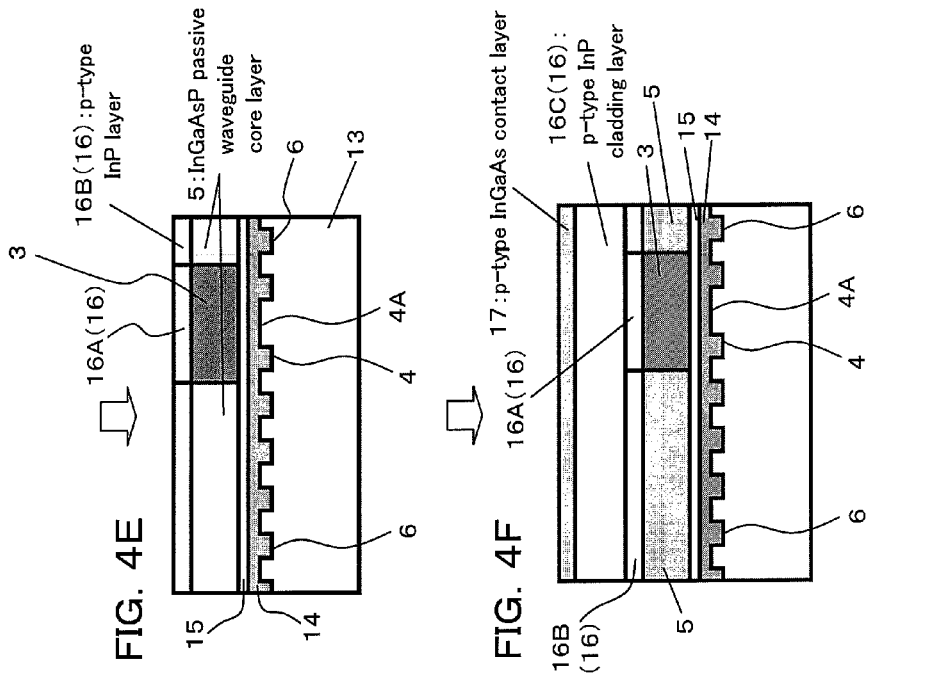

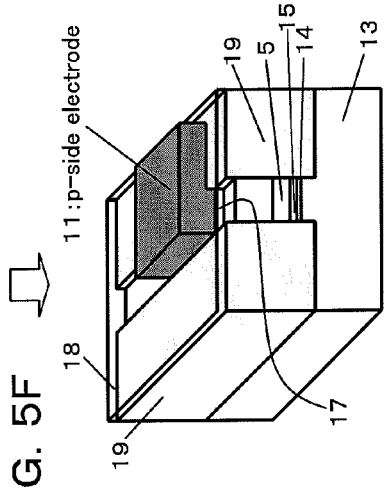
FIG. 5A
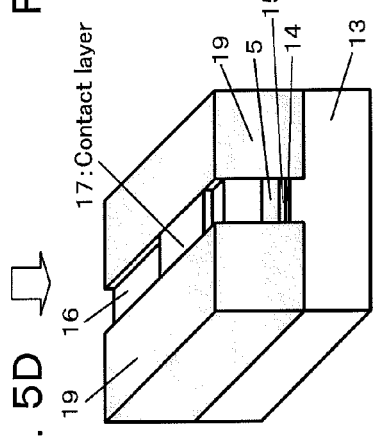
FIG. 5B
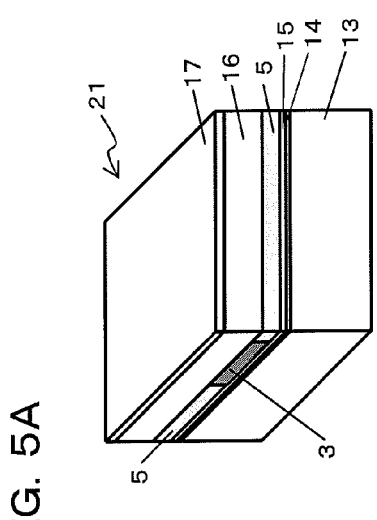
FIG. 5C
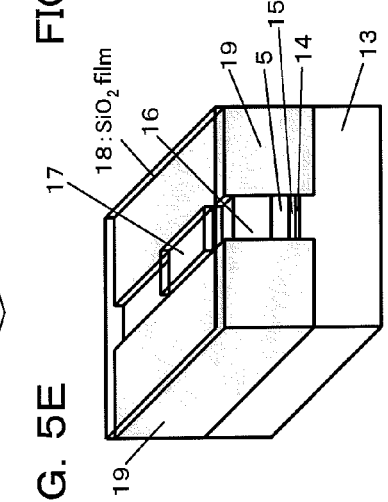
FIG. 5D  FIG. 5F
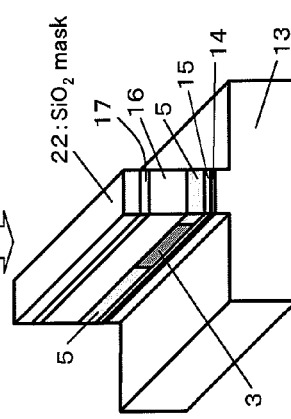
FIG. 5E
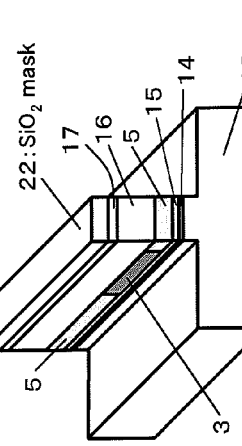
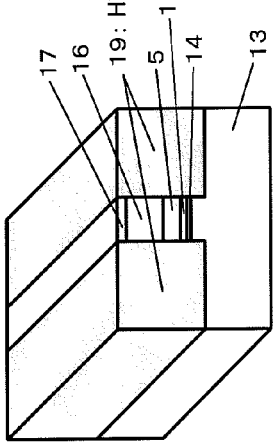
FIG. 5G

OPTICAL SEMICONDUCTOR DEVICE AND METHOD FOR MANUFACTURING THE SAME

CROSS-REFERENCE TO RELATED APPLICATION

This application is a continuation Application of a PCT international application No. PCT/JP2008/055002 filed on Mar. 18, 2008 in Japan, the entire contents of which are incorporated by reference.

FIELD

The embodiments discussed herein are related to an optical semiconductor device used for optical fiber communications, for example, and a method for manufacturing the same, and more particularly, to a semiconductor laser having a diffraction grating and a method for manufacturing the same.

BACKGROUND

Directly-modulated semiconductor lasers have been used for providing small-size optical transmitters with low power consumption and capable of operating without requiring any temperature control. At present, semiconductor lasers, which provide direct modulation at operation speeds of up to 10 Gb/s, are available for practical use.

In order to further enhance their operation speeds, the relaxation oscillation frequency, which is a limiting factor hindering an increased operation speed of a laser, is needed to be increased. For higher relaxation oscillation frequency, reduction in the cavity length is essential.

As such semiconductor lasers directed to higher-speed operation, proposed are short cavity DFB lasers depicted in FIG. 9, and short cavity DBR lasers depicted in FIG. 10.

In addition, proposed is integration of a passive grating waveguide at the rear of a DFB laser having a $\lambda/4$ phase shift structure so as to increase the output from the front, thereby effectively enhancing the reflectance at the rear.

SUMMARY

Accordingly, according to one aspect of the embodiment, an optical semiconductor device includes an active region including an active layer and a diffraction grating having a $\lambda/4$ phase shift; passive waveguide regions each including a passive waveguide and a diffraction grating, the passive waveguide regions being disposed on an emission facet side and on a rear facet side located opposing to the emission facet sandwiching the active region in between the passive waveguide regions, respectively; and an anti-reflection coating applied on the emission facet, wherein the emission facet side passive waveguide region has a length shorter than a length of the rear facet side passive waveguide region.

According to another aspect of the embodiment, a method for manufacturing an optical semiconductor device includes forming an active layer in an active region, and forming passive waveguide core layer in each of passive waveguide regions on an emission facet side and on a rear facet side located opposing to the emission facet sandwiching the active region in between the passive waveguide regions, respectively, such that the emission facet side passive waveguide region has a length shorter than a length of the rear facet side passive waveguide region; forming diffraction grating in each of the active region and the passive waveguide regions; providing a $\lambda/4$ phase shift; and applying an anti-reflection coating on the emission facet.

The object and advantages of the embodiment will be realized and attained by means of the elements and combinations particularly pointed out in the claims. It is to be understood that both the foregoing general description and the following detailed description are exemplary and explanatory and are not restrictive of the embodiment, as claimed.

BRIEF DESCRIPTION OF THE DRAWINGS

FIGS. 4A-4F are schematic cross-sectional views illustrating a method for manufacturing one exemplary configuration of the optical semiconductor device according to the first embodiment;

FIGS. 5A-5G are schematic perspective views illustrating the method for manufacturing one exemplary configuration of the optical semiconductor device according to the first embodiment;

DESCRIPTION OF EMBODIMENTS

Figure 9:
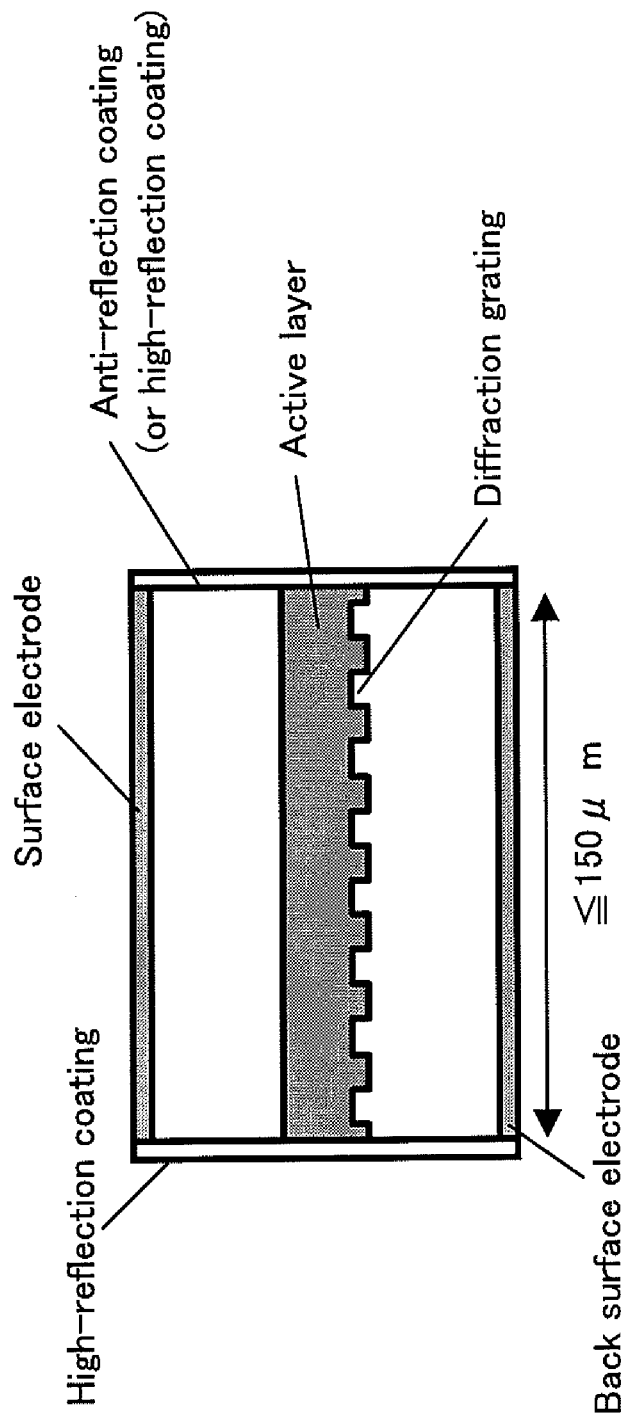
FIG. 9 is a schematic cross-sectional view illustrating the configuration of a conventional short cavity DFB laser.

In the short cavity DFB laser, as depicted FIG. 9, a high-reflection coating is required to be applied on at least one facet of the DFB laser in order to obtain a gain necessary for oscillating in a shorter active layer of about 150 μm or less, for example.

The phase of the diffraction grating cannot be controlled at a facet of such a DFB laser wherein a high-reflection coating is applied on the facet (that is, the position of the facet cannot be controlled so as to be aligned with the period of the diffraction grating). Therefore, in principle, manufacturing of only laser oscillating at a single mode is impossible, resulting in a lower yield.

Additionally, in the short cavity DFB laser as depicted in FIG. 9, an active layer is provided along the entire length of the device, meaning that the device length equals the cavity length. Thus, the cavity length is limited to lengths capable of forming by cleavage (e.g., a length of about 200 μm when the thickness of the substrate is about 100 μm), which limits sufficient reduction in the cavity length.

Figure 10:
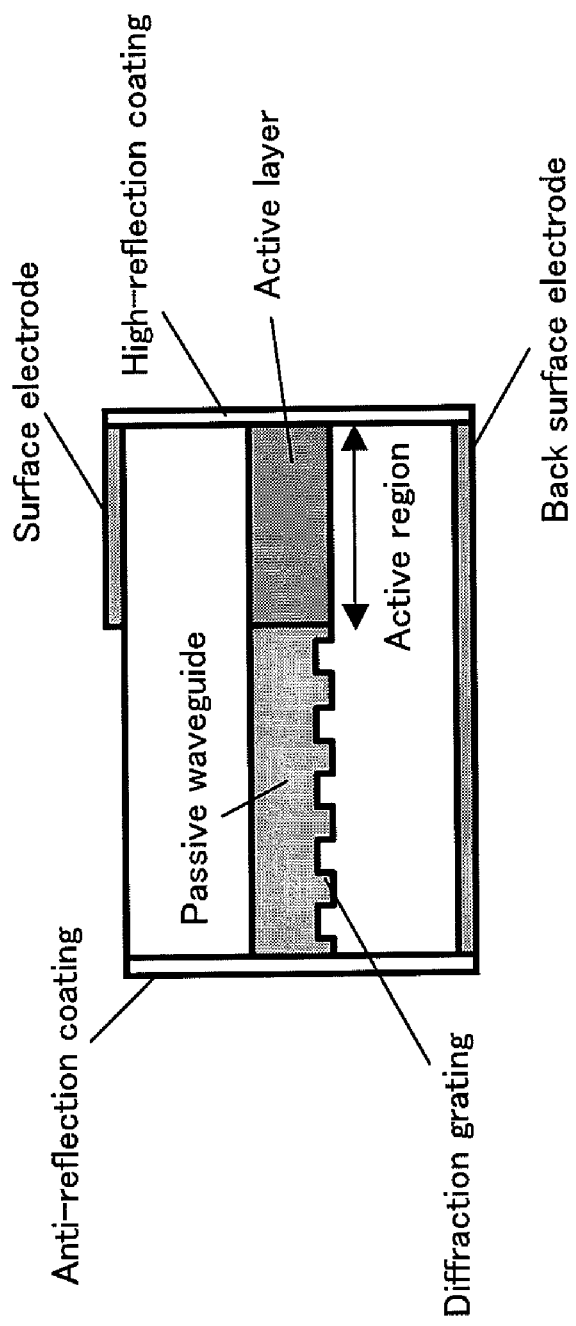
FIG. 10 is a schematic cross-sectional view illustrating the configuration of another conventional short cavity DBR laser.

In contrast, in the short cavity DBR laser as depicted in FIG. 10, the passive waveguide provided with the diffraction grating is used as a reflecting mirror, and the passive waveguide is provided so as to continue to the active layer. Thus, the length of the active layer (cavity length) can be reduced to an extent that cannot be formed by cleavage.

In this case, however, since the oscillation mode is determined by the length of the active layer formed by cleavage, and laser oscillating at a single mode (laser operating at the single mode) cannot be manufactured stably with a lower manufacturing yield.

In principle, laser operating at a single mode, allowing manufacturing with a higher yield, are $\lambda/4$-shifted DFB lasers having a $\lambda/4$ phase shift provided substantially at the center of the diffraction grating. Such $\lambda/4$-shifted DFB lasers oscillate at a certain Bragg wavelength determined by the period of the diffraction grating.

However, in order to prevent any adverse effects by the phase of the diffraction grating at the facets, such $\lambda/4$-shifted DFB lasers need anti-reflection coatings applied on their facets.

The anti-reflection coatings on the facets, however, may make achieving a sufficient gain difficult, due to absence of the facet reflection, when the cavity length is short. Even if a gain sufficient for laser oscillation is obtained, a higher-speed operation (higher speed modulation) may not be achieved.

In addition, similar to the short cavity DFB laser as depicted in FIG. 9, the cavity length is limited to lengths capable of forming by cleavage, which limits sufficient reduction in the cavity length.

Furthermore, a $\lambda/4$-shifted DFB laser may emit light from the rear facet due to the anti-reflection coatings applied on the rear and front facets, making an enhanced light output difficult.

In such a case, in an attempt to improve the light output, one might consider integration of a passive grating waveguide in the rear facet (facet opposing to the emission facet) by applying the technique disclosed in Japanese Laid-Open Patent Application No. 2002-353559.

However, the anti-reflection coating applied on the front facet (emission facet) prevents a sufficient gain from being obtained, making a higher-speed operation unattainable, when the cavity length is short.

In light of the above-identified backgrounds, an optical semiconductor device and a method for manufacturing the same are desired wherein fabrication of single-mode operating optical semiconductor devices can be reliably achieved, as well as a higher yield and sufficient reduction in the cavity length. In addition, it is desired that a sufficient gain is obtained while a higher-speed operation is achieved, even with a shorter cavity length, in addition to providing the advantage of improving the light output from the emission facet (front facet).

Hereinafter, an optical semiconductor device and a method for manufacturing the same according to embodiments will be described with reference to the drawings.

First Embodiment

An optical semiconductor device and a method for manufacturing the same according to a first embodiment will be described with reference to FIGS. 1-5G.

Figure 1:
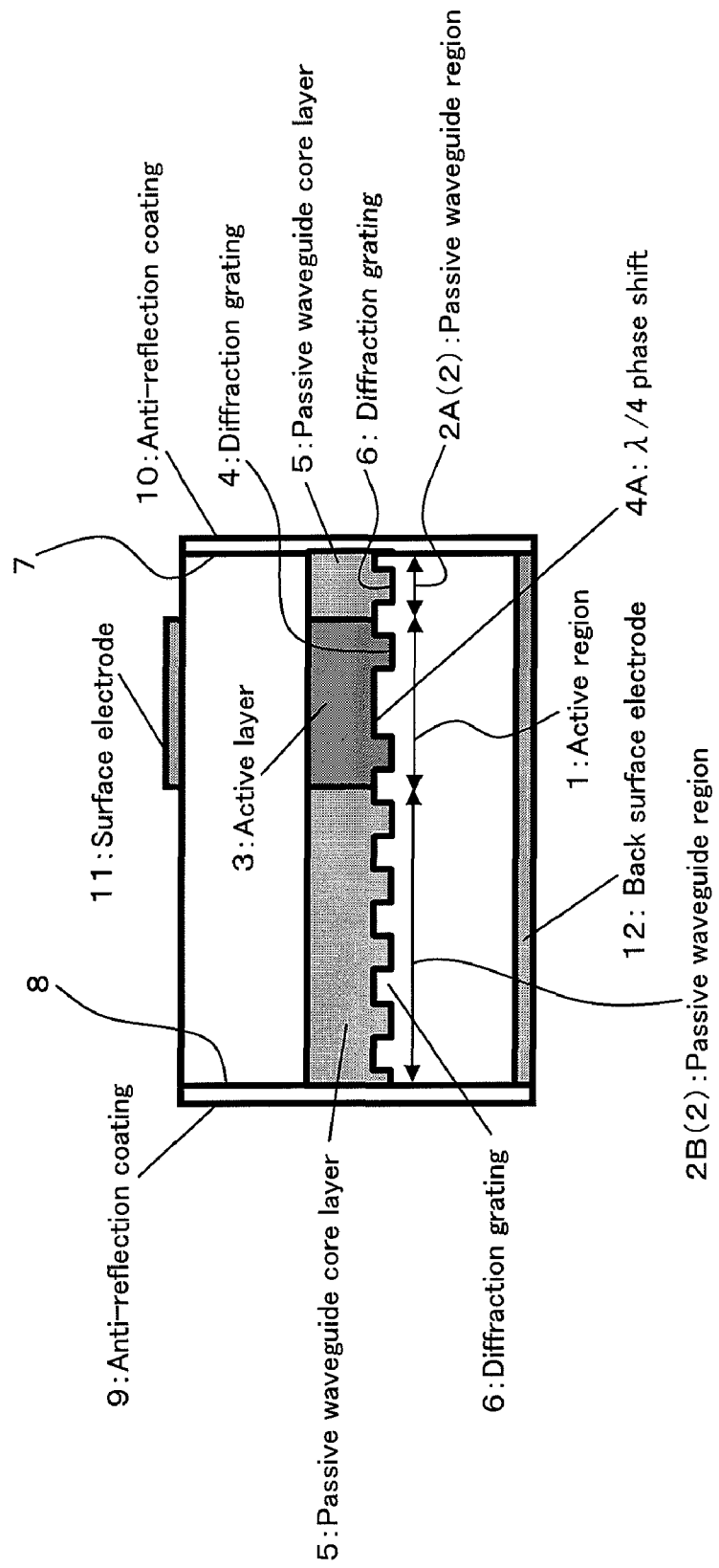
FIG. 1 is a schematic cross-sectional view schematically illustrating a configuration of an optical semiconductor device according to a first embodiment.

As depicted in FIG. 1, an optical semiconductor device according to this embodiment is a directly-modulated semiconductor laser oscillating at a single mode, and including an active region 1 that generates laser light in response to an electric current injection, and a passive waveguide region 2 to which no electric current is injected.

In this embodiment, the active region (active waveguide region; active waveguide section; $\lambda/4$-shifted DFB laser section) 1 includes an active layer 3 and a diffraction grating 4 having a $\lambda/4$ phase shift 4A.

The passive waveguide region (passive waveguide sections; mirror sections) 2 includes a passive waveguide core layer 5 and a diffraction grating 6.

The passive waveguide regions 2 are provided on front and rear sides of the active region 1, namely, on the emission facet (front facet; front end face) 7 side of the device and the rear facet (rear end face) 8 side opposing to the emission facet 7, sandwiching the active region 1 between the passive waveguide regions 2. Such a configuration allows sufficient reduction of the cavity length. In addition, a sufficient gain of laser oscillation can be achieved even with the reduced cavity length, and a higher-speed operation can also be realized.

In addition, anti-reflection coatings 9 and 10 are applied on the both facets of the device, namely, the emission and rear facets 7 and 8 of the device. This enables manufacturing of single-mode operating optical semiconductor device in a stable manner, without being affected by the phase of the diffraction gratings at the facets, improving the manufacturing yield.

Especially, in this embodiment, the length of the passive waveguide region 2A on the side of the emission facet 7 is made shorter than the length of the passive waveguide region 2B on the side of the rear facet 8. This can help to reduce the loss in the passive waveguide region 2A on the side of the emission facet 7, thereby increasing the light output emitted from the emission facet 7.

In addition, in this embodiment, the passive waveguide region 2A on the side of the emission facet 7 has the same coupling coefficient of the diffraction grating 6 as that in the passive waveguide region 2B on the side of the rear facet 8, and the reflectance of the passive waveguide region 2A on the side of the emission facet 7 is lower than the reflectance of the passive waveguide region 2B on the side of the rear facet 8. This can help to further increase the light output emitted from the emission facet 7.

Note that, in this embodiment, the diffraction grating 6 in the passive waveguide region 2 and the diffraction grating 4 in the active region 1 have the same coupling coefficient. More specifically, the diffraction grating 6 in the passive waveguide region 2 and the diffraction grating 4 in the active region 1 have the same depth of the diffraction grating (depth of groove in the diffraction grating), and further have the same duty ratio of the diffraction grating (ratio of the portion retained after etching with respect to the period of the diffraction grating). Note that, in this embodiment, the diffraction grating 6 in the passive waveguide region 2 and the diffraction grating 4 in the active region 1 have the same period.

Note that the reference symbol 11 denotes a surface electrode, and the reference symbol 12 denotes a back-surface electrode in FIG. 1.

Figure 2:
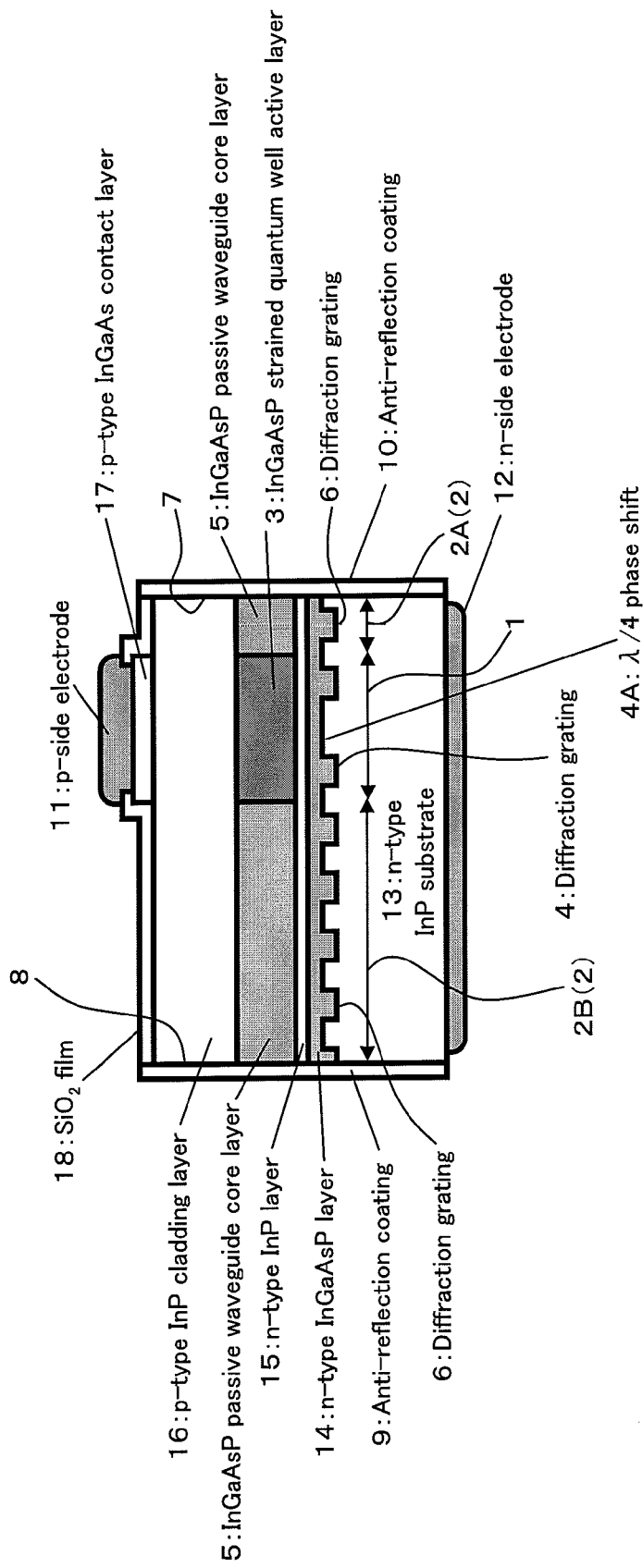
FIG. 2 is a schematic cross-sectional view schematically illustrating one exemplary configuration of an optical semiconductor device according to the first embodiment.

Here, a specific exemplary configuration of this optical semiconductor device (semiconductor laser) will be described with reference to FIG. 2. In FIG. 2, the same reference symbols are used for elements that merely represent similar elements depicted in FIG. 1.

In this optical semiconductor device (semiconductor laser), as depicted in FIG. 2, the diffraction gratings 4 and 6, (with a depth of approximately 60 nm, for example) having the same period and coupling coefficient are formed on the surface of an n-type InP substrate 13 along the entire device length (that is, across the entire region of the region to be the active region 1 and the region to be the passive waveguide region 2), and an n-type InGaAsP layer (waveguide layer;

cladding layer; a thickness of approximately 100 nm, for example) 14 having an approximately 1.15-μm composition, for example, is formed so as to bury the diffraction gratings 4 and 6.

The diffraction gratings 4 and 6 formed on the surface of the n-type InP substrate 13 along the entire device length include a λ/4 phase shift 4A in the portion corresponding to the center of the region to be the active region 1, as depicted in FIG. 2. Note that the λ/4 phase shift 4A may not be located at the center of the active region 1, for example, and it may be provided somewhere displaced from the center of the active region 1.

In addition, the diffraction grating 6 in the passive waveguide region 2 and the diffraction grating 4 in the active region 1 are formed simultaneously such that a desired phase relationship is obtained between the phases of the diffraction grating 6 in the passive waveguide region 2 and the diffraction grating 4 in the active region 1 (i.e., such that the phase relationship is not misaligned). More specifically, the diffraction grating 6 in the passive waveguide region 2 and the diffraction grating 4 in the active region 1 are formed at once by patterning a resist with a diffraction grating pattern and forming at once the diffraction grating pattern. Note that the diffraction grating 6 in the passive waveguide region 2 and the diffraction grating 4 in the active region 1 that are formed at once satisfy a desired phase relationship between the phases of the diffraction grating 6 in the passive waveguide region 2 and the diffraction grating 4 in the active region 1.

Since the diffraction grating 4 is provided with a λ/4 phase shift, it can oscillate at a certain Bragg wavelength determined by the period of the diffraction grating 4, and a stable single mode oscillation can be achieved.

In addition, as depicted in FIG. 2, above the n-type InGaAsP layer 14, formed is an n-type InP layer (having a thickness of approximately 30 nm, for example) 15, and an InGaAsP strained quantum well active layer (InGaAsP-based strained quantum well active layer; strained quantum well active layer including a InGaAsP-based semiconductor material) 3 having a composition for achieving an approximately 1.31-μm emission wavelength. InGaAsP passive waveguide core layers (InGaAsP-based passive waveguide core layers; passive waveguide core layers including a InGaAsP-based semiconductor material) 5 of an approximately 1.18-μm composition are formed on front and rear sides (the emission and rear facets 7 and 8 sides) of the InGaAsP strained quantum well active layer 3, sandwiching the active layer 3. Since the passive waveguide core layer 5 has a composition wavelength (band gap wavelength) shorter than the emission wavelength by a predetermined value (e.g., approximately 100 nm) or more, absorption at the passive waveguide core layer 5 is sufficiently suppressed.

Here, the InGaAsP strained quantum well active layer 3 has a 15-layered stack structure including InGaAsP well layers with a compressive strain of approximately 1% and a thickness of approximately 4.2 nm, and InGaAsP barrier layers with a thickness of approximately 10 nm and a band gap wavelength of approximately 1.1 μm, for example.

Preferably, InGaAsP separate confinement heterostructure (SCH) layers (light guide layers) having a thickness of approximately 10 nm and a composition of approximately 1.0 μm, for example, are provided above and below the InGaAsP strained quantum well active layer 3.

As depicted in FIG. 2, a p-type InP cladding layer (for example thickness of approximately 2.0 μm) 16 is formed so as to cover the entire of the InGaAsP strained quantum well active layer 3 and the InGaAsP passive waveguide core layers 5, and a p-type InGaAs contact layer (for example thickness of approximately 0.3 μm) 17 is formed only above the active region 1 (above the InGaAsP strained quantum well active layer 3).

Note that the active region 1 is constituted by the InGaAsP strained quantum well active layer 3 and the layers above and below the active layer 3. Here, the length of the active region 1 (the active layer 3) is approximately 100 μm, for example.

In contrast, the passive waveguide regions 2 (2A and 2B) on the sides of the emission and rear facets 7 and 8 are constituted by the InGaAsP passive waveguide core layers 5 and the layers above and below the layers 5. Here, the length of the passive waveguide region 2A on the side of the emission facet 7 (the passive waveguide core layer 5) is approximately 75 μm while the length of the passive waveguide region 2B on the side of the rear facet 8 (the passive waveguide core layer 5) is approximately 175 μm.

As described above, in this embodiment, the passive waveguide regions 2 (2A and 2B) are provided on the front and rear sides (on the sides of the emission and rear facets 7 and 8) of the active region 1, sandwiching the active region 1. Thus, regardless of a shorter length of the active region (active region length) of approximately 100 μm, for example, the length of the entire device (device length) is made as long as approximately 350 μm, for example, which is the length allowing cleavage.

In addition, the band gap of the passive waveguide region 2 is larger relative to the energy of laser light. However, since some loss may be generated, the passive waveguide region 2A on the side of the emission facet 7 is made to have a length shorter than the length of the passive waveguide region 2B on the side of the rear facet 8, as described previously. This can help to increase the light output emitted from the emission facet 7.

In addition, in this embodiment, the passive waveguide region 2A on the side of the emission facet 7 has the same coupling coefficient of the diffraction grating 6 as that in the passive waveguide region 2B on the side of the rear facet 8, and the reflectance (the reflectance of the diffraction grating 6) of the passive waveguide region 2A on the side of the emission facet 7 is smaller than the reflectance (the reflectance of the diffraction grating 6) of the passive waveguide region 2B on the side of the rear facet 8. This can even further increase the light output emitted from the emission facet 7.

Figure 3:
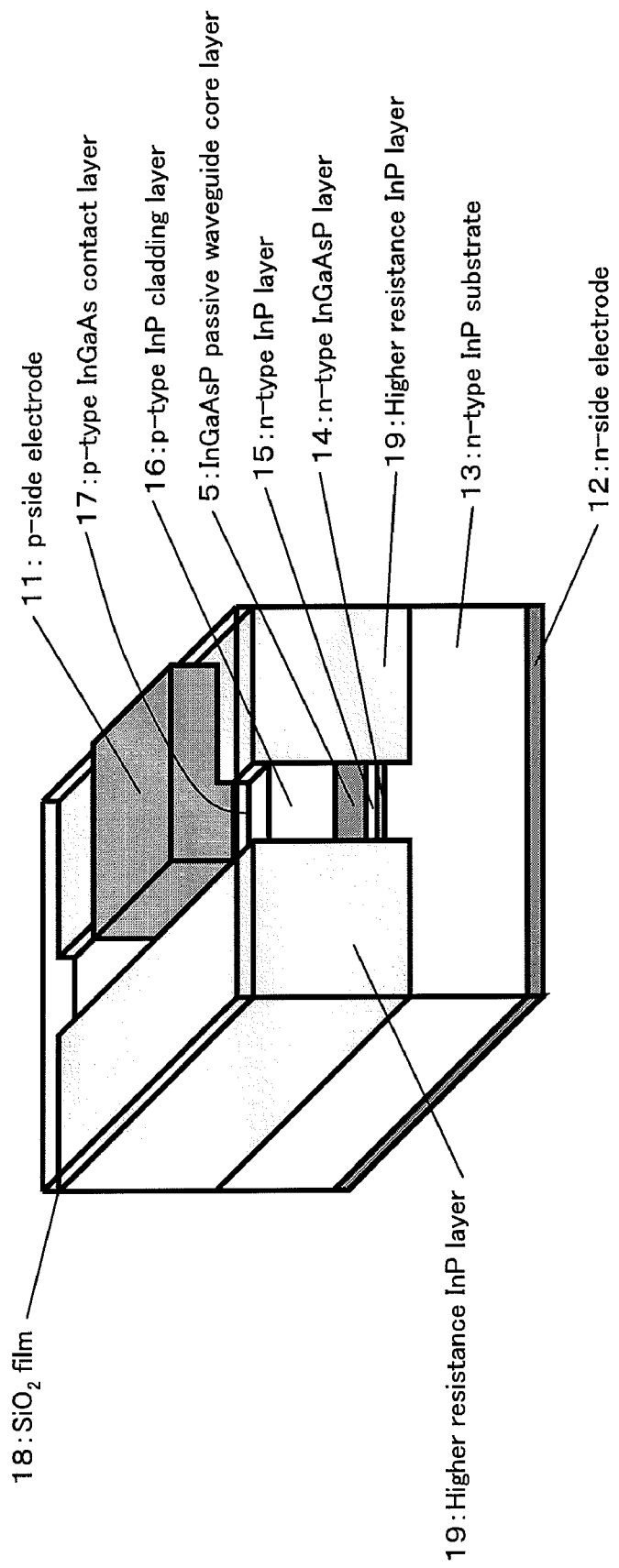
FIG. 3 is a schematic perspective view schematically illustrating one exemplary configuration of an optical semiconductor device according to the first embodiment.

In addition, in this embodiment, as depicted in FIG. 3, the waveguide structure along the horizontal direction (lateral direction in FIG. 2) constitutes higher resistance buried structure (semi-insulating buried heterostructure; SI-BH structure) (higher resistance buried laser). Note that the anti-reflection coating (facet coating) 10 is omitted in FIG. 3 for ease of illustration.

More specifically, as depicted in FIG. 3, the waveguide structure has the structure wherein the regions on opposite sides of a mesa structure (stripe mesa structure of approximately 1.3 μm wide, for example) including a p-type InGaAs contact layer 17, a p-type InP cladding layer 16, an InGaAsP-based passive waveguide core layer 5, an InGaAsP strained quantum well active layer 3 (not illustrated), an n-type InGaAsP layer 14, and a part of the n-type InP substrate 13, having diffraction gratings 4 and 6 (not illustrated) on the surface thereof, are buried with an Fe-doped InP layer (higher resistance InP layer; semi-insulating InP layer) 19, for example.

Furthermore, this optical semiconductor device includes electrodes 11 and 12 formed in the same structure as conventional structures. More specifically, a p-side electrode 11 made from Au/Zn/Au, for example, is formed on the p-type InGaAs contact layer 17, and an n-side electrode 12 made from AuGe/Au, for example, is formed on the back surface of the n-type InP substrate 13.

In addition, as depicted in FIGS. 2 and 3, an $SiO_2$ film (insulation film) 18 is formed on the surface of the device, excluding the region where the p-side electrode 11 is provided. Furthermore, anti-reflection coatings 9 and 10 are applied on the facets, namely, the emission and rear facets 7 and 8 of the device.

Especially, in this embodiment, the passive waveguide regions 2 (2A and 2B) provided on the front and rear sides (on the sides of the emission and rear facets 7 and 8) of the active region 1, sandwiching the active region 1, include the diffraction grating 6, as described above. The diffraction grating 6 acts as reflecting mirrors feeding back light to the active region 1, and the threshold gain required for laser oscillation is reduced. Therefore, even with a device which is provided with the anti-reflection coatings 9 and 10 on the front and rear facets thereof, and has a shorter length of the active region 1 (active region length) of approximately 100 μm, for example, a gain sufficient for oscillation can be obtained, achieving a reliable laser oscillation, which enables a higher-speed operation (higher speed modulation).

In addition, in this embodiment, the front and rear facets are provided with the anti-reflection coatings 9 and 10, and the diffraction grating 4 has the $\lambda/4$ phase shift 4A at the center of the active region 1. Furthermore, the diffraction gratings 4 and 6 are formed at once, and the phase relationship between the diffraction grating 6 in the passive waveguide region 2 and the diffraction grating 4 in the active region 1 are predetermined, as set forth previously. Accordingly, since the oscillation mode is not influenced by any phase variation caused by different facet positions, a stable single mode oscillation can be achieved, assuring the stability of the single mode.

Next, a method for manufacturing a specific exemplary configuration of the optical semiconductor device (semiconductor laser) will be described with reference to FIGS. 4A-4F and FIGS. 5A-5G.

Firstly, a diffraction grating pattern is formed on an n-type InP substrate 13 at once using electron beam exposure technique and so forth, for example. Then, using this diffraction grating pattern, diffraction gratings 4 and 6 are formed at once which have a $\lambda/4$ phase shift 4A at the portion corresponding to the center of the region to be the active region 1 on the surface of the n-type InP substrate 13, across the entire device length (that is, across the entire of the region to be the active region 1 and the region to be the passive waveguide regions 2), with ethane-based reactive ion etching, as depicted in FIGS. 4A and 4B, for example.

Since the diffraction grating 4 in the active region 1 is provided with a $\lambda/4$ phase shift 4A, it can oscillate at a certain Bragg wavelength determined by the period of the diffraction grating 4, enabling a stable single mode oscillation.

Note that diffraction gratings 6 having the same coupling coefficient are formed in the regions to be the passive waveguide region 2A on the side of the emission facet 7 and the passive waveguide region 2B on the side of the rear facet 8. More specifically, diffraction gratings having the configuration described above are formed.

Next, as depicted in FIG. 4C, on the n-type InP substrate 13 having the diffraction gratings 4 and 6 formed on the surface thereof, an n-type InGaAsP layer 14, an n-type InP layer 15, an InGaAsP strained quantum well active layer 3, and a part of a p-type InP layer (cladding layer) 16 (about 0.2 μm thick, in this embodiment) 16A are sequentially grown using metal organic vapor phase epitaxy (MOVPE) technique, for example.

Subsequently, after forming an $SiO_2$ film over the entire surface, the $SiO_2$ film is removed, except for the region to be the active region 1, using typical lithography technique. Thereafter, as depicted in FIG. 4D, the p-type InP layer 16A and the InGaAsP strained quantum well active layer 3 in the region to be the passive waveguide region 2 are removed using the remaining $SiO_2$ film as a mask ($SiO_2$ mask) 20, by wet etching, for example. During this process, the n-type InP layer 15 functions as an etching stop layer.

Thereafter, as depicted in FIG. 4E, an InGaAsP passive waveguide core layer 5 and a part of a p-type InP layer (cladding layer) 16 (about 0.2 μm thick, in this example) 16B are selectively grown, sequentially, using an MOVPE apparatus, for example, with $SiO_2$ mask 20 being remained. As a result, the active region 1 and the passive waveguide regions 2 are directly coupled (butt-joint coupled), and the passive waveguide regions 2 are formed on the front and rear sides of the active region 1 (on the sides of the emission and rear facets 7 and 8), sandwiching the active region 1.

In this embodiment, the passive waveguide region 2A having a length of approximately 75 μm, for example, is formed on the emission facet 7 side of the active region 1 having a length of approximately 100 μm, for example, while the passive waveguide region 2B having a length of approximately 175 μm, for example, is formed on the rear facet 8 side.

In this manner, the InGaAsP strained quantum well active layer 3 is formed in the active region 1, and the InGaAsP passive waveguide core layers 5 are form in the passive waveguide regions 2A and 2B on the emission facet 7 side and the rear end face 8 side opposing to the emission facet 7, sandwiching the active region 1 between the passive waveguide regions 2A and 2B, such that the passive waveguide region 2A on the side of the emission facet 7 is shorter than the passive waveguide region 2B on the side of the rear facet 8.

Subsequently, after removing the $SiO_2$ film 20 used as the mask, a portion 16C for obtaining a remaining part of the p-type InP layer (cladding layer) 16 and a p-type InGaAs contact layer 17 are sequentially grown over the entire surface of the wafer using MOVPE technique, for example, as depicted in FIG. 4F.

As a result, the semiconductor stack structure 21 is formed, as depicted in FIG. 5A.

Next, an $SiO_2$ film is formed over the entire surface of the semiconductor stack structure 21, and this $SiO_2$ film is processed into an approximately 1.3-μm wide stripe, for example, using typical photolithography, as depicted in FIG. 5B. Thereafter, using this $SiO_2$ film as a mask ($SiO_2$ mask) 22, etching is performed by means of chlorine-based inductive coupled plasma (ICP) dry etching, for example, to form a mesa structure of approximately 3 μm high, for example.

Next, the damage layer damaged during the dry etching is removed by etching the surface of the mesa structure by about 0.1 μm, for example, using hydrochloric acid-based wet etching, for example. Thereafter, with the $SiO_2$ mask 22 being remained, the regions on the opposite sides of the mesa structure are buried (buried regrown) with a higher resistance InP layer 19 by growing an Fe-doped InP layer (higher resistance InP layer) 19, for example, using MOVPE technique, for example, as depicted in FIG. 5C.

During this growth, by additionally introducing a chlorine-containing compound, such as $CH_3Cl$, for example, into the reactor, the mesa structure can be buried while reducing irregular growth above the mesa structure even for the mesa structure formed by dry etching.

Next, as depicted in FIG. 5D, after selectively removing the p-type InGaAs contact layer 17 by wet etching, while leaving the portion above the active region 1, for example. After forming an SiO$_2$ film 18 as a passivation film over the entire surface, the portion of the SiO$_2$ film 18 on the p-type InGaAs contact layer 17 is removed, as depicted in FIG. 5E, and a p-side electrode 11 is formed on the p-type InGaAs contact layer 17, as depicted in FIG. 5F.

Thereafter, the back surface of the n-type InP substrate 13 is polished to reduce the thickness of the n-type InP substrate 13 to approximately 100 μm, for example, and an n-side electrode 12 is formed on the back surface of the n-type InP substrate 13, as depicted in FIG. 5G.

Finally, after cleavage into an array, anti-reflection coatings 9 and 10 are applied on the front and rear facets (the emission and facets 7 and 8) (see FIG. 2), and the manufacturing of an optical semiconductor device (semiconductor laser) made into chips is completed.

As set forth above, according to an optical semiconductor device and a method for manufacturing the same according to this embodiment, fabrication of single-mode operating optical semiconductor devices can be reliably achieved, as well as a higher yield and sufficient reduction in the cavity length. Thus, a gain sufficient for laser oscillation can be obtained while a higher-speed operation can be achieved, even with a shorter cavity length, in addition to providing the advantage of improving the light output from the emission facet 7.

As set forth above, according to the optical semiconductor device, a cavity structure can be obtained which includes an active region 1 that is sufficiently short for achieving a higher-speed operation and which can provide a gain sufficient for oscillation with an even shorter active region 1, wherein the oscillation mode is not influenced by any phase variation caused by different facet positions. Thus, a semiconductor laser (short cavity laser for higher speed modulation) is achieved which enables device formation by cleavage, enables direct modulation at a higher speed of 10 Gb/s or higher, and provides a stable single mode operation and an improved light output from the emission facet 7.

Second Embodiment

Next, an optical semiconductor device and a method for manufacturing the same according to a second embodiment will be described with reference to FIG. 6.

Figure 6:
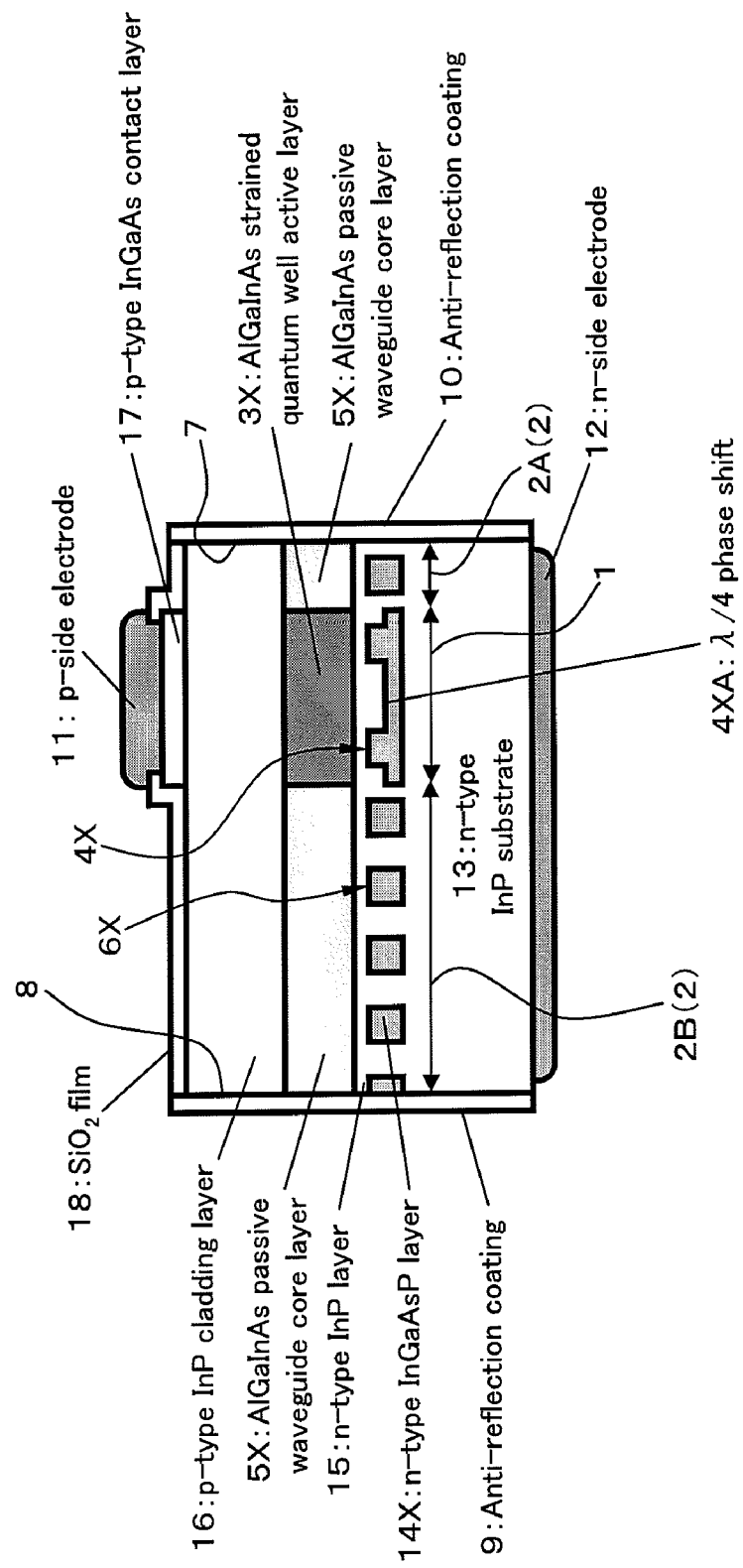
FIG. 6 is a schematic cross-sectional view schematically illustrating one exemplary configuration of an optical semiconductor device according to a second embodiment.

An optical semiconductor device (semiconductor laser) according to this embodiment and a method for manufacturing the same is different from the above-described first embodiment in that, as depicted in FIG. 6, a diffraction grating 6X included in each of passive waveguide regions 2 has a larger coupling coefficient than the coupling coefficient of the diffraction grating 4X included in the active region 1, and that an AlGaInAs-based quantum well active layer (quantum well active layer including an AlGaInAs-based semiconductor material) 3X is used as an active layer while an AlGaInAs-based passive waveguide core layer (passive waveguide core layer including a AlGaInAs-based semiconductor material) 5X is used as a passive waveguide core layer. The same elements in FIG. 6 as those in the above-described first embodiment (see FIGS. 1 and 2) are referenced by the like reference symbols.

More specifically, firstly, in this embodiment, as depicted in FIG. 6, the diffraction grating 6X in the passive waveguide region 2 has a depth larger than the depth of the diffraction grating 4X in the active region 1. Note that, in this embodiment, the diffraction grating in the passive waveguide region 2 and the active region 1 have the same duty ratio (ratio of the remained area after etching with respect to the period of the diffraction grating).

As a specific exemplary configuration, as depicted in FIG. 6, an n-type InGaAsP layer (diffraction grating layer; waveguide layer; cladding layer) 14X having an approximately 1.15-μm composition is formed on the n-type InP substrate 13, with an optional n-type InP buffer layer (not illustrated) interposed therebetween, for example. On the n-type InGaAsP layer 14X, the diffraction gratings 4X and 6X having the same period are formed across the entire device length (that is, across the entire of the region to be the active region 1 and the region to be the passive waveguide region 2), and the n-type InP layer 15 is formed so as to bury the diffraction gratings 4X and 6X.

In this embodiment, in the active region 1, as depicted in FIG. 6, the diffraction grating 4X with a depth of approximately 60 nm, for example (the diffraction grating 4X having grooves with a depth of approximately 60 nm, for example) is formed by forming periodic grooves on the surface of the n-type InGaAsP layer 14X having a thickness of approximately 100 nm, by etching from the surface thereof, for example. This diffraction grating 4X is then buried with an n-type InP layer 15. More specifically, the active region 1 has the structure wherein the diffraction grating 4X formed by forming periodic grooves on the n-type InGaAsP layer 14X are buried with the n-type InP layer 15. Similar to the above-described first embodiment, a λ/4 phase shift 4XA is provided in the active region 1, as depicted in FIG. 6.

In the passive waveguide regions 2, as depicted in FIG. 6, the diffraction gratings 6X with a depth of approximately 100 nm, for example (diffraction gratings 6X having grooves with a depth of approximately 100 nm, for example), are formed by periodically dividing the n-type InGaAsP layer 14X having a thickness of approximately 100 nm, for example. These diffraction gratings 6X are then buried with the n-type InP layer 15. More specifically, the passive waveguide region 2 has the structure wherein the diffraction grating 6X formed by periodically dividing the n-type InGaAsP layer 14X is buried with the n-type InP layer 15.

In this embodiment, the AlGaInAs-based quantum well active layer 3X is used as an active layer while the AlGaInAs-based passive waveguide core layer 5X is used as a passive waveguide core layer.

One specific exemplary configuration is constructed as follows.

As the AlGaInAs-based quantum well active layer 3X, for example, an AlGaInAs strained quantum well active layer having a 15-layered stack structure of a composition for achieving a approximately 1.31-μm emission wavelength is used, which includes AlGaInAs well layers having a compressive strain of approximately 1.5% and a thickness of approximately 6 nm, and AlGaInAs barrier layers having a thickness of approximately 10 nm, a band gap wavelength of approximately 1.05 μm, and a tensile strain of approximately 0.3%. Note that SCH layers may be provided above and below the AlGaInAs-based strained quantum well active layer 3X. In this example, the AlGaInAs-based quantum well active layer 3X (the active region 1) has a length (active region length) of approximately 75 μm, for example.

As the AlGaInAs-based passive waveguide core layer 5X, an AlGaInAs passive waveguide core layer is used having a band gap wavelength of approximately 1.15 μm, for example. Since the passive waveguide core layer 5X has the band gap wavelength (composition wavelength) shorter than the emission wavelength by a predetermined value (e.g., 100 nm) or more, absorption at the passive waveguide core layer 5X is sufficiently suppressed. In this example, the length of the passive waveguide region 2A on the side of the emission facet 7 (the passive waveguide core layer 5X) is approximately 50 μm while the length of the passive waveguide region 2B on the side of the rear facet 8 (the passive waveguide core layer 5X) is approximately 125 μm.

As described above, similar to the above-described first embodiment, in this embodiment, the passive waveguide regions 2 (2A and 2B) are formed on the front and rear sides (on the sides of the emission and rear facets 7 and 8) of the active region 1, sandwiching the active region 1. Thus, regardless of a shorter length of the active region (active region length) of approximately 75 μm, for example, the length of the entire device (device length) is made as long as approximately 250 μm, for example, which is the length allowing cleavage.

Especially, since, in this embodiment, the coupling coefficient of the diffraction grating 6X in the passive waveguide region 2 is made larger than that in the above-described first embodiment by forming deeper diffraction gratings 6X in the passive waveguide region 2 (that is, thicker diffraction grating layer 14X in the passive waveguide region 2), the passive waveguide region 2 can be shortened. In addition, in this embodiment, since the diffraction grating 6X in the passive waveguide region 2 has a larger coupling coefficient than that in the above-described first embodiment, the length of the active region 1 can also be reduced. This can help to reduce the device length.

In addition, similar to the above-described first embodiment, the band gap of the passive waveguide region 2 is larger relative to the energy of laser light. However, since some loss may be generated, the passive waveguide region 2A on the side of the emission facet 7 is made to have a length shorter than the length of the passive waveguide region 2B on the side of the rear facet 8, as described previously. This can help to increase the light output emitted from the emission facet (front facet) 7.

In addition, in this embodiment, similar to the above-described first embodiment, the passive waveguide region 2A on the side of the emission facet 7 has the same coupling coefficient of the diffraction grating 6 as that in the passive waveguide region 2B on the side of the rear facet 8, and the reflectance (the reflectance of the diffraction grating 6) of the passive waveguide region 2A on the side of the emission facet 7 is smaller than the reflectance (the reflectance of the diffraction grating 6) of the passive waveguide region 2B on the side of the rear facet 8. This can even further increase the light output emitted from the emission facet 7.

The other elements are similar to the configuration and the specific exemplary configuration of the above-described first embodiment, and descriptions thereof will be omitted.

Next, a method for manufacturing a specific exemplary configuration of an optical semiconductor device (semiconductor laser) according to this embodiment will be described.

Firstly, an n-type InGaAsP layer 14X having a thickness of approximately 100 nm and a band gap wavelength of approximately 1.15 μm, for example, and an n-type InP layer 15 having a thickness of approximately 20 nm, for example, are sequentially grown on the n-type InP substrate 13 (see FIG. 6), and an optional n-type InP buffer layer (not illustrated) may be interposed on the substrate 13.

Next, a diffraction grating pattern is formed at once by using an electron beam exposure apparatus and so forth, for example. Using this pattern, the n-type InGaAsP layer 14X is etched to a depth of approximately 60 nm, for example, from the surface thereof, by using ethane-based reactive ion etching and so forth, for example, to form at once diffraction grating (with a depth of approximately 60 nm, for example) on the surface of the n-type InGaAsP layer 14X, across the entire device length (that is, across the entire of the region to be the active region 1 and the region to be the passive waveguide region 2).

Subsequently, after covering a region of the device which is to be the active region 1 by using a photoresist, for example, etching is performed once again, by means of ethane-based reactive ion etching, for example, to reach at the n-type InP substrate 13 (or n-type InP buffer layer) to form the diffraction grating (having a depth of approximately 100 nm, for example) in the n-type InGaAsP layer 14X.

As a result, the diffraction gratings 4X and 6X having different depths are formed in the n-type InGaAsP layer 14X in the region to be the active region 1 and the region to be the passive waveguide region 2. More specifically, in the region to be the active region 1, the diffraction grating (with a depth of approximately 60 nm, for example) 4X having the λ/4 phase shift 4XA is formed at the portion corresponding to its center thereof. In contrast, in the region to be the passive waveguide region 2, the diffraction gratings 6X having a greater depth than the diffraction grating 4X (depth of approximately 100 nm, for example) are formed by etching the n-type InGaAsP layer 14X to a depth deeper than the etching depth in the region to be the active region 1 (see FIG. 6). In this manner, the diffraction grating 6X having a coupling coefficient larger than the coupling coefficient of the diffraction grating 4X formed in the region to be the active region 1 is formed in the region to be the passive waveguide region 2.

Note that diffraction gratings 6X having the same coupling coefficient are formed in the regions to be the passive waveguide region 2A on the side of the emission facet 7 and the passive waveguide region 2B on the side of the rear facet 8. More specifically, diffraction gratings having the configuration described above are formed.

Since the diffraction grating 4X in the active region 1 is provided with a λ/4 phase shift 4XA, it can oscillate at a certain Bragg wavelength determined by the period of the diffraction grating 4X, enabling a stable single mode oscillation.

Next, after growing an n-type InP layer 15 to a thickness of approximately 50 nm, for example, from the top of the n-type InGaAsP layer 14X, on the n-type InGaAsP layer 14X, in which the diffraction gratings 4X and 6X are formed, using MOVPE technique, for example, the AlGaInAs strained quantum well active layer 3X and a part of a p-type InP layer (upper cladding layer) 16 (about 0.2 μm, in this example) are sequentially grown (see FIG. 6).

Subsequently, in the manner similar to the above-described first embodiment, after removing the p-type InP layer 16 and the AlGaInAs strained quantum well active layer 3X in the region to be the passive waveguide region 2, an AlGaInAs passive waveguide core layer 5X and a part of a p-type InP layer (cladding layer) 16 (about 0.2 μm, in this example) are selectively grown in sequence. As a result, the active region 1 and the passive waveguide region 2 are directly coupled (buttjoint coupled), the passive waveguide region 2 are formed on the front and rear sides of the active region 1 (on the sides of the emission and rear facets 7 and 8), sandwiching the active region 1.

In this embodiment, the passive waveguide region 2A having a length of approximately 50 μm, for example, is formed on the emission facet 7 side of the active region 1 having a length of approximately 75 μm, for example, while the passive waveguide region 2B having a length of approximately 125 μm, for example, is formed on the rear facet 8 side.

In this manner, the AlGaInAs strained quantum well active layer 3X is formed in the active region 1, and the AlGaInAs passive waveguide core layers 5X are formed in the passive waveguide regions 2A and 2B on the emission facet 7 side and the rear facet 8 side opposing to the emission end face 7, sandwiching the active region 1 between the passive waveguide regions 2A and 2B, such that the passive waveguide region 2A on the side of the emission facet 7 is shorter than the passive waveguide region 2B on the side of the rear facet 8.

The subsequent steps are similar to those in the method for manufacturing the specific exemplary configuration of the above-described first embodiment, and descriptions thereof will be omitted.

As set forth above, similar to the first embodiment described above, according to an optical semiconductor device and a method for manufacturing the same according to this embodiment, fabrication of single-mode operating optical semiconductor devices can be reliably achieved, as well as a higher yield and sufficient reduction in the cavity length. Thus, a gain sufficient for laser oscillation can be obtained while a higher-speed operation can be achieved, even with a shorter cavity length, in addition to providing the advantage of improving the light output from the emission facet 7.

Especially, when the diffraction gratings have the same reflectance as that in the above-described first embodiment, the wavelength band of the passive waveguide region 2 functioning as reflecting mirror is widened when the coupling coefficient is made larger and the length (waveguide length) of the passive waveguide region 2 is reduced, as in the case of this embodiment. Accordingly, this has an advantage of enhancing the allowable tolerance when the Bragg wavelengths in the active region 1 and the passive waveguide region 2 are misaligned.

In addition, the AlGaInAs-based strained quantum well active layer 3X having a greater relaxation oscillation frequency used as an active layer can provide another advantage in that devices suited for higher-speed operations can be realized.

The above-described embodiment is different from the above-described first embodiment in that, the diffraction grating 6X included in each of the passive waveguide regions 2 has a higher coupling coefficient than the coupling coefficient of the diffraction grating 4X included in the active region 1, that the AlGaInAs-based quantum well active layer 3X is used as an active layer while the AlGaInAs-based passive waveguide core layer 5X is used as a passive waveguide core layer. However, one of the above two differences may be practiced.

In addition, the depth of the diffraction grating in the passive waveguide region 2 is varied from that in the active region 1 so that the diffraction grating of the passive waveguide region 2 and the diffraction grating of the active region 1 have different coupling coefficients in the above-described embodiment, but it is not limited to this. The coupling coefficient of the diffraction grating in the passive waveguide region 2 may be varied from that in the active region 1 by changing at least one of the depth of diffraction grating and the duty ratio (ratio of the period of the diffraction grating to the area remaining after etching) of the diffraction grating in the passive waveguide regions 2 from that in the active region 1.

For example, the coupling coefficient of the diffraction grating in the passive waveguide region 2 can be varied from that in the active region 1 by using different duty ratios of the diffraction grating in the passive waveguide region 2 and the active region 1 while using the same depth of the diffraction grating in both the passive waveguide region 2 and the active region 1.

Figure 7:
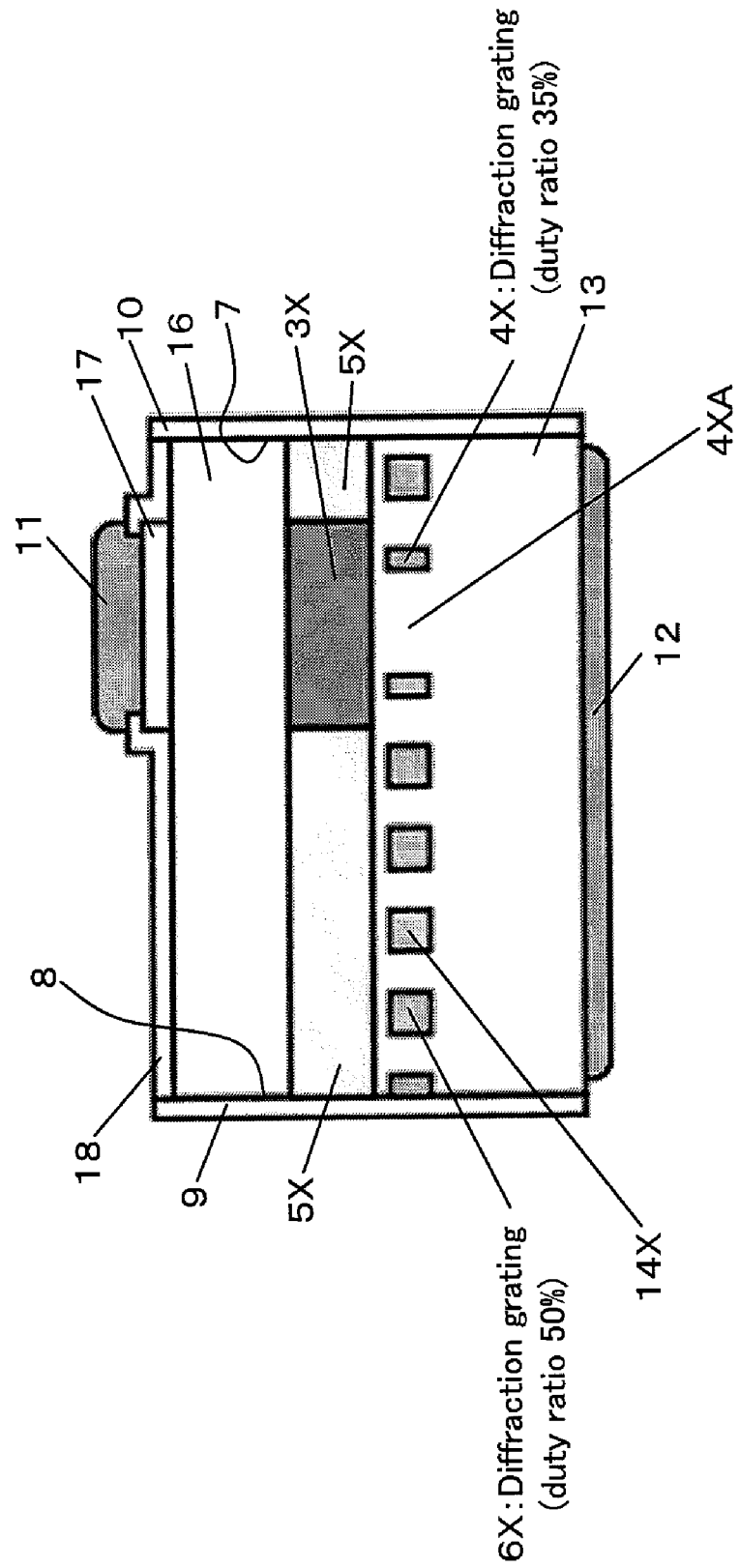
FIG. 7 is a schematic cross-sectional view schematically illustrating another exemplary configuration of an optical semiconductor device according to the second embodiment.

For example, as depicted in FIG. 7, the diffraction gratings (having a depth of approximately 100 nm, for example) 4X and 6X are formed by etching the n-type InGaAsP layer 14X to reach at the n-type InP substrate 13 (or n-type InP buffer layer) across the entire device, thereby processing the n-type InGaAsP layer 14X in a thin line shape, as opposed to the case in the above-described embodiment (see FIG. 6). In this case, the ratio of the area remaining after etching with respect to the period of the diffraction grating (the n-type InGaAsP layer 14X, in this case) (duty ratio) may be set to 50% in the passive waveguide region 2 while setting the ratio of the area remaining after etching the period of the diffraction grating (the n-type InGaAsP layer 14X, in this case) to 35% in the active region 1. Note that the diffraction gratings 4X and 6X having such a pattern can be obtained by changing the conditions for electron beam exposure, for example, for the active region 1 from the exposure conditions for the passive waveguide region 2.

As described above, it is preferable that the duty ratio of the diffraction gratings be set to 50% or around 50% in the passive waveguide region 2 while setting the duty ratio of the active region 1 to a value smaller than the duty ratio of the diffraction grating of the passive waveguide region 2. In other words, it is preferable that the diffraction grating be formed in the active region 1 with a duty ratio smaller than the duty ratio for forming the diffraction grating in the passive waveguide region 2.

In principle, it is possible that the duty ratio of the diffraction gratings be set to 50% or around 50% in the passive waveguide regions 2 while setting the duty ratio of the active region 1 to a value greater than the duty ratio of the diffraction grating in the passive waveguide region 2. However, for ease of manufacturing, it is preferable that the duty ratio of the diffraction grating be set to 50% or around 50% in the passive waveguide region 2 while setting the duty ratio of the active region 1 to a value smaller than the duty ratio of the diffraction grating in the passive waveguide region 2.

As described above, if the duty ratio of the diffraction grating 6X is set to 50% or around 50% in the passive waveguide region 2 while setting the duty ratio of the diffraction grating 4X in the active region 1 to a value smaller than the duty ratio of the diffraction grating 6X in the passive waveguide region 2 when the diffraction gratings 4X and 6X are formed by etching the n-type InGaAsP layer 14X and the diffraction gratings 4X and 6X are buried with the n-type InP layer 15, the ratio of the higher refractive index portion (the n-type InGaAsP layer 14X, in this case) with respect to the period of the diffraction grating in the passive waveguide region 2 becomes 50% or around 50%, and the ratio of the higher refractive index portion (the n-type InGaAsP layer 14X, in this case) with respect to the period of the diffraction grating in the active region 1 becomes smaller than that in the passive waveguide region 2, as depicted in FIG. 7.

On the contrary, as in the above-described first embodiment (see FIG. 2), if the duty ratio of the diffraction grating 6 is set to 50% or around 50% in the passive waveguide region 2 while setting the duty ratio of the diffraction grating 4 in the active region 1 to a value smaller than the duty ratio of the diffraction grating 6 in the passive waveguide region 2 when the diffraction gratings 4 and 6 are formed by etching the n-type InP substrate 13 and the diffraction gratings 4 and 6 are buried with the n-type InGaAsP layer 14, the ratio of the higher refractive index portion (the n-type InGaAsP layer 14, in this case) with respect to the period of the diffraction grating in the passive waveguide regions 2 becomes 50% or around 50%, and the ratio of the higher refractive index portion (the n-type InGaAsP layer 14, in this case) with respect to the period of the diffraction grating in the active region 1 becomes larger than that in the passive waveguide regions 2.

Others

Note that the passive waveguide region 2A on the side of the emission facet 7 and the passive waveguide region 2B on the side of the rear facet 8 are configured such that the coupling coefficient of the diffraction grating 6 is the same and that the reflectance of the passive waveguide region 2A on the side of the emission facet 7 is lower than the reflectance of the passive waveguide region 2B on the side of the rear facet 8 in the above-described embodiments and variants thereof, but it is not limited to this. The coupling coefficient of the diffraction grating 6 in the passive waveguide region 2A on the side of the emission facet 7 may be different from that in the passive waveguide region 2B on the side of the rear facet 8.

For example, the coupling coefficient of the diffraction grating 6 in the passive waveguide region 2A on the side of the emission facet 7 may be different from that in the passive waveguide region 2B on the side of the rear facet 8, and the reflectance of the passive waveguide region 2A on the side of the emission facet 7 may be lower than the reflectance of the passive waveguide region 2B on the side of the rear facet 8. In addition, the coupling coefficient of the diffraction grating 6 in the passive waveguide region 2A on the side of the emission facet 7 may be different from that in the passive waveguide region 2B on the side of the rear facet 8, and the reflectance of the passive waveguide region 2A on the side of the emission facet 7 may be the same as the reflectance of the passive waveguide region 2B on the side of the rear facet 8.

In this case, in order to varying the coupling coefficient of the diffraction grating 6 in the passive waveguide region 2A on the side of the emission facet 7 from that in the passive waveguide region 2B on the side of the rear facet 8, at least one of the depth of diffraction grating 6 and the duty ratio of the diffraction grating 6 (the ratio of the area remaining after etching with respect to the period of the diffraction grating 6) in the passive waveguide region 2A on the side of the emission facet 7 may be changed from that in the passive waveguide region 2B on the side of the rear facet 8.

In addition, in the above embodiments and variants thereof, anti-reflection coatings 10 and 9 are applied on each of the emission and rear facets 7 and 8, but it is not limited to this. It is sufficient to apply an anti-reflection coating on at least emission facet. For example, rather than applying an anti-reflection coating on the rear facet, an absorption layer may be interposed between the rear facet side passive waveguide region and the rear facet so as to prevent any light reflected on the rear facet from reentering into the active layer and causing any adverse effects.

When the waveguide included in the active region 1 and the waveguide included in the passive waveguide region 2 are made by directly coupling (butt-joint coupling) them, as in the above-described embodiments and variants thereof, some deviation in the film thickness or composition may be generated in the potion of layer constituting the passive waveguide region 2 in the vicinity of the active region 1, depending on fabrication technique employed. Such a deviation may affect the phase relationship among the active region 1 and the passive waveguide region 2. However, a stable single mode oscillation can be achieved even in such a case by introducing a phase shift in the diffraction grating pattern so that the phase deviation can be compensated, as long as the same structure can be formed in the repeatable manner. Of course, it is preferred that the layer constituting the passive waveguide region 2 be manufactured under the conditions for preventing any variation, thereby avoiding introduction of a phase shift.

In addition, the active region and the passive waveguide region are formed by directly coupling (butt-joint coupling) the waveguide in the above-described embodiments and variants thereof, but it is not limited to this. For example, a quantum well active layer may be formed in both the active region and the passive waveguide region, and the passive waveguide core layer may be made by converting the portion of the quantum well active layer in the passive waveguide region into a mixed crystal. In this case, the active layer in the active region is constituted by the quantum well active layer, and the waveguide core layer in the passive waveguide region is constituted by the waveguide core layer obtained by converting the quantum well active layer in the active region into a mixed crystal.

Figure 8:
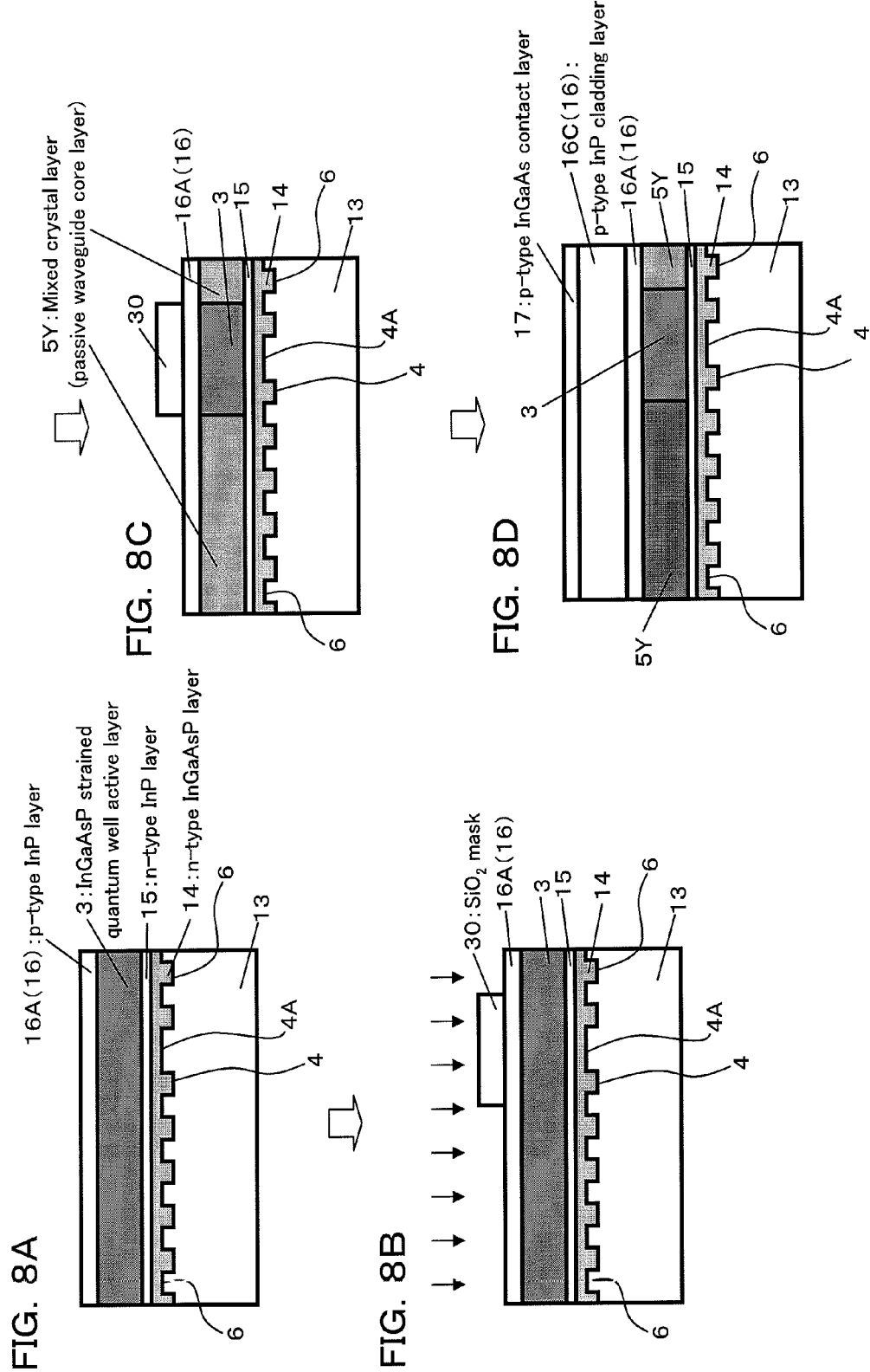
FIGS. 8A-8D are schematic cross-sectional views illustrating a variant of a method for manufacturing one exemplary configuration of the optical semiconductor device according to the first embodiment.

For example, after forming an InGaAsP strained quantum well active layer 3 as an active layer in the active region 1 over the entire area of the device in the manner similar to the above-described first embodiment (see FIGS. 4A-4C), as depicted in FIG. 8A, a part 16A of a p-type InP cladding layer 16 may be grown on the active layer 3. Thereafter, as depicted in FIG. 8B, an SiO$_2$ mask 30 is formed overlying the region to be the active region 1 of the p-type InP cladding layer 16A, followed by conversion of a quantum well structure into a mixed crystal by implanting ions into the region to be the passive waveguide region 2, and a subsequent anneal at an elevated temperature, for example, as depicted in FIG. 8C. Thereby, the part of the InGaAsP strained quantum well active layer 3 formed in the region to be the passive waveguide region 2 is converted into a mixed crystal, as depicted in FIG. 8C, and the resulting layer having an enhanced band gap and reduced absorption can be utilized as a passive waveguide core layer (InGaAsP-based passive waveguide core layer) 5Y constituting the passive waveguide regions 2. Subsequently, after removing the SiO$_2$ mask 30, a remaining portion 16C of a complete p-type InP layer (cladding layer) 16 and a p-type InGaAs contact layer 17 are sequentially grown over the entire surface of the wafer using MOVPE technique, for example, as depicted in FIG. 8D. The subsequent steps are similar to those in the method for manufacturing the specific exemplary configuration of the above-described first embodiment, and descriptions thereof will be omitted.

This variant has an advantage that residual reflection is unlikely to occur since the waveguide is continuous across the active region 1 and the passive waveguide region 2 without any discontinuities, although absorption is increased to some degree since compositions available for the waveguide is limited.

In addition, mixed crystal region generally exhibit a reduced refractive index of waveguide. Thus, it is preferable to adjust such that the Bragg wavelength in the passive waveguide region 2 coincides with that in the active region 1. This can be done by using a greater period of the diffraction grating 6 in the region to be the passive waveguide region 2 than the period of the diffraction grating 6 in the region to be the active region 1, according to the refractive index difference between the regions, or by increasing the width of waveguide in the region to be the passive waveguide region 2 (active layer width) relative to the waveguide width in the region to be the active region 1 (active layer width), according to the refractive index difference between the regions.

Here, after growth of a part of a p-type InP cladding layer 16, the quantum well active layer 3 is converted into a mixed crystal by implanting ions into the region to be the passive waveguide region 2, followed by an anneal at an elevated temperature, for example, but it is not limited to this. For example, after completing of the p-type InP cladding layer 16 and forming the p-type InGaAs contact layer 17, the quantum well active layer 3 may be converted into a mixed crystal.

Although the above variant is illustrated as a variant of a manufacturing method of one exemplary configuration of the above-described first embodiment, this variant may be applied to one exemplary configuration of the above-described second embodiment and any other exemplary configurations. In such a case, the AlGaInAs strained quantum well active layer 3X formed in the region to be the passive waveguide region 2 may be converted into a mixed crystal to obtain a passive waveguide core layer (AlGaInAs-based passive waveguide core layer) constituting the passive waveguide region 2.

Note that the present invention is not limited to the configurations (particularly, specific configurations) of the embodiments and the variants set forth above, and may be modified in various manners without departing from the sprit of the present invention.

For example, a wider variety of the design parameters, such as the length of the active region, the length of the passive waveguide region, and coupling coefficient of the diffraction grating, may be possible according to applications.

In addition, a wide design variety of variations of parameters for the structure of the quantum well active layer may be possible, such as the layer thickness, the composition, and the number of layers.

Although an AlGaInAs-based multiple quantum well active layer or InGaAsP-based multiple quantum well active layer is used as an active layer in the above-described embodiments and variants thereof, it is not limited to this. Other multiple quantum well active layers made from other based materials may also be used. Furthermore, a thick bulk film may be used as an active layer, although posing an disadvantage in terms of higher-speed operation. Alternatively, quantum dots may be used.

In addition, although the specific exemplary configurations of the above embodiments and variants thereof have been described as being applied to 1.3 μm wavelength band semiconductor laser, it is not limited to this and they may also be applied to 1.55 μm wavelength band semiconductor laser, for example.

In addition, an AlGaInAs-based passive waveguide core layer or InGaAsP-based passive waveguide core layer having a thick film bulk structure is used as a passive waveguide core layer forming the passive waveguide region in the above-described embodiments and variants thereof, but it is not limited to this. For example, the passive waveguide core layer having a multi-layered structure, such as a quantum well structure, may be used, or the passive waveguide core layer made from other based materials may be used.

In addition, although the active region and the passive waveguide region are made from common based semiconductor materials in the above-described embodiments and variants thereof, it is not limited to this. For example, the active region may be formed having an AlGaInAs-based quantum well active layer, and the passive waveguide region may be formed having an InGaAsP-based passive waveguide core layer. Furthermore, the active region may be formed having an InGaAsP-based quantum well active layer, and the passive waveguide region may be formed having an AlGaInAs-based passive waveguide core layer.

AlGaInAs-based semiconductor materials having the same band gap wavelength as that of InGaAsP-based semiconductor materials exhibit a higher refractive index than that of InGaAsP-based semiconductor materials. For this reason, when the refractive index of an InGaAsP-based passive waveguide core layer is adjusted for a AlGaInAs-based quantum well active layer having an emission wavelength of 1.3 μm wavelength band, the band gap wavelength of an InGaAsP-based passive waveguide core layer becomes as small as a level where adverse effects of absorption begin to be manifested. In such a case, using a AlGaInAs-based passive waveguide core layer is preferred, as in the above-described second embodiment.

In addition, although the above-described embodiments and variants thereof have been described in the context of an optical semiconductor device formed on an n-type InP substrate, the conductive type of the substrate is not limited to this. For example, a higher resistance InP substrate (SI-InP substrate; higher resistance substrate) capable of reducing the device capacitance is preferable for achieving higher-speed operation. In addition, a p-type InP substrate (p-type substrate) may be used, although current spreading to a region other than the active region is increased due to the upper cladding layer being n-type. In addition, a substrate made from a semiconductor material other than InP may be used. For example, the present disclosure can also be applicable to an optical semiconductor device (semiconductor laser) formed on a GaAs substrate. An optical semiconductor device (semiconductor laser) in a communication wavelength band may be obtained using a GaAs substrate by forming an active layer using GaInNAs-based semiconductor materials or quantum dot and so forth. In addition, a shorter wavelength optical semiconductor device (semiconductor laser) may be fabricated using GaAs/AlGaAs based semiconductor materials, GaAs/InGaAsP based semiconductor materials, GaInP/AlGaInP based semiconductor materials, and the like.

In addition, an SI-BH structure is employed as the waveguide structure in the above-described embodiments and variants thereof, but it is not limited to this. For example, other buried structures, such as a pn buried structure using a p-type electric current blocking layer and an n-type electric current blocking layer, or SI-PBH structures wherein a higher resistance layer is buried but a p-type InP cladding layer is formed over the entire surface and so forth, may be used. Alternatively, ridge waveguide structures may be employed.

Although diffraction gratings are formed on the surface of an n-type InP substrate in the above-described first embodiment and variants thereof, and diffraction gratings are formed by periodically dividing an n-type InGaAsP layer formed on n-type InP substrate or forming periodic grooves in an n-type InGaAsP layer formed on n-type InP substrate in the above-described second embodiment and variants thereof, it is not limited to these. Any other variations are also possible.

For example, in the variant of the above-described second embodiment, the diffraction grating may be formed by forming periodic grooves in the entire region (active region and passive waveguide region) of an n-type InGaAsP layer formed on the n-type InP substrate.

In addition, for example, when the coupling coefficient of the diffraction grating 6 in the passive waveguide region 2A on the side of the emission facet 7 is varied from that in the passive waveguide region 2B on the side of the rear facet 8, the diffraction grating in the passive waveguide region 2A on the side of the emission facet 7 and the passive waveguide region 2B on the side of the rear facet 8 may be formed by combining various techniques as set forth above.

In addition, the diffraction grating may be formed in the interface between a plurality of other semiconductor layers stacked on a semiconductor substrate.

In addition, the diffraction grating may be formed above the active layer, rather than below the active layer, although direct coupling (butt joint coupling) of the waveguide may pose a challenge in this case since the junction tends not to be completely flat.

In addition, the diffraction grating may be formed so as to be exposed on the surface of the device, or the diffraction grating may be formed on sides of the ridge waveguide structure when a ridge waveguide is used.

In addition, in the above-described embodiments and variants thereof, a $\lambda/4$ phase shift is provided in a diffraction grating as a phase shift. Other than forming a phase shift upon formation of the diffraction grating, an equivalent phase shift may be provided by partially modifying the equivalent refractive index of the waveguide, for example, by partially varying the width of the active layer.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a illustrating of the superiority and inferiority of the invention. Although the embodiments have been described in detail, it should be understood that the various changes, substitutions, and alterations could be made hereto without departing from the spirit and scope of the invention.

What is claimed is:

1. An optical semiconductor device comprising:
   an active region comprising an active layer and a diffraction grating having a $\lambda/4$ phase shift;
   passive waveguide regions each comprising a passive waveguide and a diffraction grating, the passive waveguide regions being disposed on an emission facet side and on a rear facet side located opposing to the emission facet, wherein two adjacent passive waveguide regions sandwiching the active region in between; and
   an anti-reflection coating applied on the emission facet side,
   wherein the passive waveguide region on the emission facet side has a length shorter than a length of the other passive waveguide region on the rear facet side.

2. The optical semiconductor device according to claim 1, wherein the passive waveguide region on the emission facet side has a reflectance lower than a reflectance of the other passive waveguide region on the rear facet side.

3. The optical semiconductor device according to claim 1, wherein the diffraction grating of the passive waveguide region on the emission facet side has the same coupling coefficient as a coupling coefficient of the diffraction grating of the other passive waveguide region on the rear facet side.

4. The optical semiconductor device according to claim 1, wherein the diffraction grating comprised in each of the passive waveguide regions has a coupling coefficient greater than a coupling coefficient of the diffraction grating comprised in the active region.

5. The optical semiconductor device according to claim 1, wherein the diffraction grating comprised in each of the passive waveguide regions has a depth deeper than a depth of the diffraction grating comprised in the active region.

6. The optical semiconductor device according to claim 1, wherein a duty ratio of the diffraction grating comprised in the active region is smaller than a duty ratio of the diffraction grating comprised in each of the passive waveguide regions.

7. The optical semiconductor device according to claim 6, wherein the duty ratio of the diffraction grating comprised in each of the passive waveguide regions is around 50%.

8. The optical semiconductor device according to claim 1, wherein the diffraction grating comprised in the active region and the diffraction grating comprised in each of the passive waveguide regions are formed simultaneously.

9. The optical semiconductor device according to claim 1, wherein the active layer is a quantum well active layer including an AlGaInAs-based semiconductor material.

10. The optical semiconductor device according to claim 1, wherein the passive waveguides each comprise a passive waveguide core layer including an AlGaInAs-based semiconductor material.

11. The optical semiconductor device according to claim 1, wherein the active layer is a quantum well active layer including an InGaAsP-based semiconductor material.

12. The optical semiconductor device according to claim 1, wherein the passive waveguides each comprise a passive waveguide core layer including an InGaAsP-based semiconductor material.

13. The optical semiconductor device according to claim 1, wherein the active layer is a quantum well active layer, and the passive waveguides each comprise a waveguide core layer being a mixed crystal of the quantum well active layer.

14. A method for manufacturing an optical semiconductor device, comprising:
    forming an active layer in an active region, and forming passive waveguide core layer in each of passive waveguide regions on an emission facet side and on a rear facet side located opposing to the emission facet, wherein two adjacent passive waveguide regions sandwiching the active region in between such that the passive waveguide region on the emission facet side has a length shorter than a length of the other passive waveguide region on the rear facet side;
    forming diffraction grating in each of the active region and the passive waveguide regions;
    providing a $\lambda/4$ phase shift; and
    applying an anti-reflection coating on the emission facet side.

15. The method for manufacturing an optical semiconductor device according to claim 14, wherein the forming the diffraction grating comprises forming the diffraction grating having the same coupling coefficient in each of the passive waveguide region on the emission facet side and the other passive waveguide region on the rear facet side.

16. The method for manufacturing an optical semiconductor device according to claim 14, wherein the forming the diffraction grating comprises forming, in each of the passive waveguide regions, the diffraction grating having a coupling coefficient greater than a coupling coefficient of the diffraction grating formed in the active region.

17. The method for manufacturing an optical semiconductor device according to claim 14, wherein the forming the diffraction grating comprises forming, in each of the passive waveguide regions, the diffraction grating having a depth deeper than a depth of the diffraction grating formed in the active region.

18. The method for manufacturing an optical semiconductor device according to claim 14, wherein the forming the diffraction grating comprises forming the diffraction grating in the active region having a duty ratio smaller than a duty ratio of the diffraction grating in each of the passive waveguide regions.

19. The method for manufacturing an optical semiconductor device according to claim 14, the forming the active layer and the passive waveguide core layer comprises:
   forming a quantum well active layer in each of the active region and the passive waveguide regions; and
   forming the passive waveguide core layer in each of the passive waveguide regions by forming a mixed crystal of the quantum well active layer located in each of the passive waveguide regions.

20. The method for manufacturing an optical semiconductor device according to claim 14, wherein the forming the diffraction grating comprises forming the diffraction grating having a $\lambda/4$ phase shift in the active region.

* * * * *